United States Patent
Fendley et al.

(10) Patent No.: US 7,190,583 B1
(45) Date of Patent: Mar. 13, 2007

(54) SELF CONTAINED, LIQUID TO AIR COOLED, MEMORY TEST ENGINEERING WORKSTATION

(75) Inventors: Tracy W. Fendley, Fort Collins, CO (US); Rick T. Euker, Loveland, CO (US); Brent W. Thordarson, Fort Collins, CO (US)

(73) Assignee: Verigy Pte Ltd, Singapore (SG)

( * ) Notice: Subject to any disclaimer, the term of this patent is extended or adjusted under 35 U.S.C. 154(b) by 0 days.

(21) Appl. No.: 11/214,085

(22) Filed: Aug. 29, 2005

(51) Int. Cl.
*H05K 7/20* (2006.01)
*G01R 31/02* (2006.01)

(52) U.S. Cl. ............... 361/701; 361/696; 361/701; 361/702; 324/760; 165/80.4; 165/80.5

(58) Field of Classification Search ............ 361/699, 361/701–702, 724; 324/760; 165/80.4–80.5
See application file for complete search history.

(56) References Cited

U.S. PATENT DOCUMENTS

| | | | | |
|---|---|---|---|---|
| 5,239,487 A | * | 8/1993 | Horejsi et al. | 702/184 |
| 5,254,942 A | * | 10/1993 | D'Souza | 714/727 |
| 5,323,847 A | * | 6/1994 | Koizumi et al. | 165/104.33 |
| 5,396,170 A | * | 3/1995 | D'Souza | 324/158.1 |
| 5,825,615 A | * | 10/1998 | Ohara | 361/683 |
| 5,828,223 A | * | 10/1998 | Rabkin et al. | 324/754 |
| 5,946,250 A | * | 8/1999 | Suzuki | 365/201 |
| 6,166,907 A | * | 12/2000 | Chien | 361/699 |
| 6,314,034 B1 | * | 11/2001 | Sugamori | 365/201 |
| 6,631,340 B2 | * | 10/2003 | Sugamori et al. | 702/122 |
| 6,883,128 B2 | * | 4/2005 | Kang et al. | 714/738 |
| 6,910,162 B2 | * | 6/2005 | Co et al. | 714/718 |
| 6,967,842 B2 | * | 11/2005 | Aoki et al. | 361/701 |
| 2002/0118033 A1 | * | 8/2002 | Koide | 324/760 |
| 2005/0083657 A1 | * | 4/2005 | Hamman | 361/699 |
| 2006/0077776 A1 | * | 4/2006 | Matsushima et al. | 369/30.27 |

* cited by examiner

*Primary Examiner*—Michael Datskovosky
*Assistant Examiner*—Robert J. Hoffberg

(57) ABSTRACT

Although various embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth herein.

20 Claims, 2 Drawing Sheets

SELF CONTAINED, LIQUID TO AIR COOLED, MEMORY TEST ENGINEERING WORKSTATION

BACKGROUND OF THE INVENTION

1. Field of the Invention

The present invention relates generally to engineering workstations used for testing or setting up tests for electronic devices. More particularly, embodiments of the invention relate to self-contained, liquid cooled engineering test stations that meet OSHA requirements and can be used in an office environment.

2. Description of Related Art

Product life cycles are rapidly shrinking and manufacturers are seeing an increased mix of memory devices on test floors and in manufacturing facilities. Very large memory testing systems, roughly the size of a small automobile, requiring industrial power of over 200 volts are presently operating on test floors and in manufacturing facilities. These large memory testing systems use programs, written by test engineers, to test memory devices, such as flash memory devices, on or off a wafer before the memory device is sold to a customer.

When a new memory device is created, a test engineer must create a test program for testing the new memory device on the large memory testing system. The test engineer must use the large, expensive test system to prepare and test the new test program. The test engineer goes to the product manufacturing or test area to use the large test system to generate a new test program for the new part. This stops production and testing of other parts and devices on the product line.

Furthermore, it is difficult to write and troubleshoot a new test program on a large system because accessibility to manual probing of a device under test is difficult in a large system that is meant to test multiples of devices at the same time.

What is needed is a smaller testing device or engineer workstation that can be used and operated in an office environment where design and test engineers work. The engineer workstation should be portable so it can be moved from office to office. It would also be useful for the engineer workstation to use the same protocols and software as the large testing systems so that programs developed and created by a test engineer are compatible on both systems.

BRIEF SUMMARY OF THE INVENTION

An embodiment of the invention provides a self-contained engineering memory test station that can be used in an office environment. The site module or circuit test electronics, protocols and software are completely compatible with large scale test equipment found on a manufacturing or test floor so that programs created by a test engineer are compatible with both systems.

An embodiment of an exemplary engineering workstation has a cabinet containing electronic circuitry for testing an electronic device external to the workstation. A water-to-air heat exchanger, pump, fluid reservoir, fan(s) and a water block are all contained in the cabinet. The water block is in heat conductive contact and/or thermal communication with at least some of the electronic circuitry inside the cabinet. The pump and fan(s), along with the other components of the workstation produce less than 50 decibels of sound. An exemplary workstation meets OSHA requirements for noise and operates off of a normal office electrical outlet providing between 90 and 240 volts AC. An exemplary workstation can dissipate about 1200 watts of heat produced by the circuitry in an office environment. Furthermore, the cooling system can keep the water block within +/−3 degrees Celsius of a preselected temperature. In various embodiments the preselected temperature is around 30 degrees Celsius which is slightly warmer than the normal temperature of an office environment which ranges from about 19 to 27 degrees Celsius.

The overall weight of an exemplary workstation should be less than about 125 pounds and the overall dimensions should allow the workstation to fit under a desk or lab table.

The above summary of the invention is not intended to represent each embodiment or every aspect of the present invention.

BRIEF DESCRIPTION OF THE DRAWINGS

Various objects and advantages of this invention will become apparent and more readily appreciated from the following Detailed Description of the Exemplary Embodiments of the Invention, taken in conjunction with the accompanying drawings, of which.

DETAILED DESCRIPTION OF THE EXEMPLARY EMBODIMENTS OF THE INVENTION

Exemplary embodiments of the present invention will now be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure is thorough and complete, and will fully convey pertinent aspects of the invention to those skilled in the art.

New, emerging test methodologies require a test system and engineering workstation that provides a parallel configuration with large manufacturing and test facility systems. Using a large manufacturing and test facility system by itself for both test program creation and the full scale testing of electronic devices is not cost effective and often not feasible.

Embodiments of the invention provide a cost-effective engineering development system that is designed for the office environment that provides flexibility and a cost effective device to test a full spectrum of memory devices. The single scaleable platform of an exemplary engineering development system allows engineers to develop test programs independent of the large scale production system(s), while maintaining total compatibility.

Embodiments of the present engineering development system feature a compact portable design that allows it to easily roll under office work surfaces, such as a desk or table. It operates on power from a standard electrical outlet and is air cooled. The cooling system does not use a compressor. The device under test (DUT) connector interface allows for simple hand insertion. Furthermore, embodiments include a wireless keyboard and mouse for optimal ergonomics.

Figure 1:
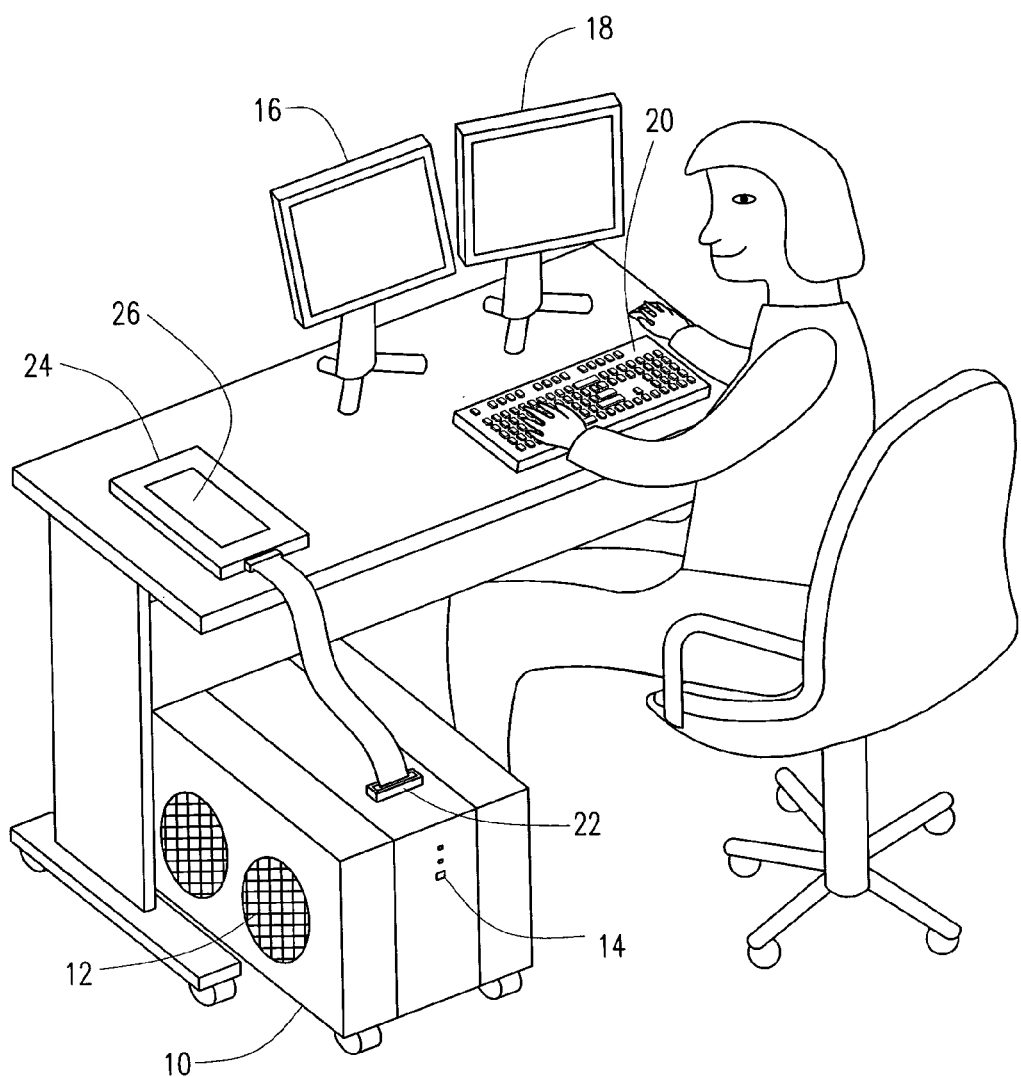
FIG. 1 depicts an exemplary engineering workstation in an office environment.

Referring to FIG. 1, an exemplary engineering workstation 10 is shown. The engineering workstation is on wheels and is of a size to allow it to be moved about in an office environment and kept under a table or desk. An exemplary engineering workstation has chassis dimensions of about 17"w×30"d×22"h and weighs less than 125 lbs.

Inside the workstation 10, there is a site module, which includes circuitry that powers a DUT, provide I/O signals to the DUT, as well as an algorithmic pattern generator (APG) that generates the test patterns used to test the DUT.

Generally, large systems found on the manufacturing or test floor have 30 to 40 site modules for testing multiple and large quantities of devices in a manufacturing environment. The large scale systems use an external water and cooling system which provide water or cooling fluids from the manufacturing floor to the large scale system to cool the electronics therein.

The workstation 10 has the functionality of the large system, but is scaled down and meets safety and OSHA requirements for office use. The workstation 10, includes an AC to DC power supply allowing the workstation 10 to be plugged into any office voltage ranging from 90 to 220 volts. Industrial voltage of at least 200 volts or more is not necessarily required to operate embodiments of the invention.

A power converter board, to be discussed later, converts the DC voltage, from the AC to DC power supply, to various different voltages used by the site module and other onboard electronics such as pumps and fans. The power converter board also may include circuitry to control a cooling system that is built into the workstation 10. An exemplary built-in cooling system includes some fans, a cooling fluid, a water-to-air heat exchanger, a pump and a reservoir for holding the cooling fluid. Temperature sensors are found in various places inside the workstation 10 to provide temperature measurements to the cooling system control circuitry to help control fan speed based on water temperature.

Vent holes 12 provide access for fan propelled airflow through the workstation 10. There are vent holes 12 on both sides of the workstation 10, one side for air intake and the other side for air exhaust. Exemplary workstations can dissipate about 1200 watts of heat on a continuous basis.

An on/off switch 14 is on a front panel of the workstation. When an exemplary workstation 10 is plugged into a wall outlet it comes on automatically in a standby mode. When the on/off switch 14 is switched to the on position the system becomes ready to be booted by a computer controller (i.e., PC) (not specifically shown).

Two user interface monitors 16 and 18 are connected to the computer controller or perhaps to the workstation 10 itself. An advantage of using two monitors 16 and 18 is that they allow a user or test engineer who is creating a test program to view and edit the test program on screen while running the test program on the other screen. This dual screen set up is ergonomic in that they make the test program easier to create, debug and run without having to go back and forth on a single screen between applications.

The keyboard 20, in this exemplary embodiment, is a wireless keyboard. Though not necessary, a wireless keyboard provides additional ergonomics to the system by allowing a user to being able to more freely move about the DUT while testing. The user can be measuring something on the DUT and press a keyboard key while away from the desk and next to the DUT. This provides additional flexibility for the test engineer creating and debugging a test program for a particular device. The exemplary wireless keyboard 20 uses RF signals, but may also be able to operate using infrared. A wired keyboard may also be used.

A very high density mating (VHDM) connector 22 is provided to connect a circuit board 24 to the workstation 10. The VHDM connector 22 allows the circuit board 24, which holds the DUT 26, to be connected to the workstation 10. The VHDM connector provides connections for the I/O signals, power and any other electrical connections needed between the workstation 10 and the DUT 26. Such other signals may include trigger signals, click signals, termination impedances, measurement modes etc.

The printed circuit board 24 can be developed or designed by the user, test engineer or customer. The printed circuit board 24 that holds the DUT may also be provided in a standardized format with the workstation 10 as an accessory.

Embodiments of the present invention are generally used to test electronic devices, DUTS, such as flash memories, digital logic devices, ROM, synchronous flash memories, SRAM, EEPROM, EPROM, FPGA, EPOV, DRAM and microcontrollers.

Figure 2:
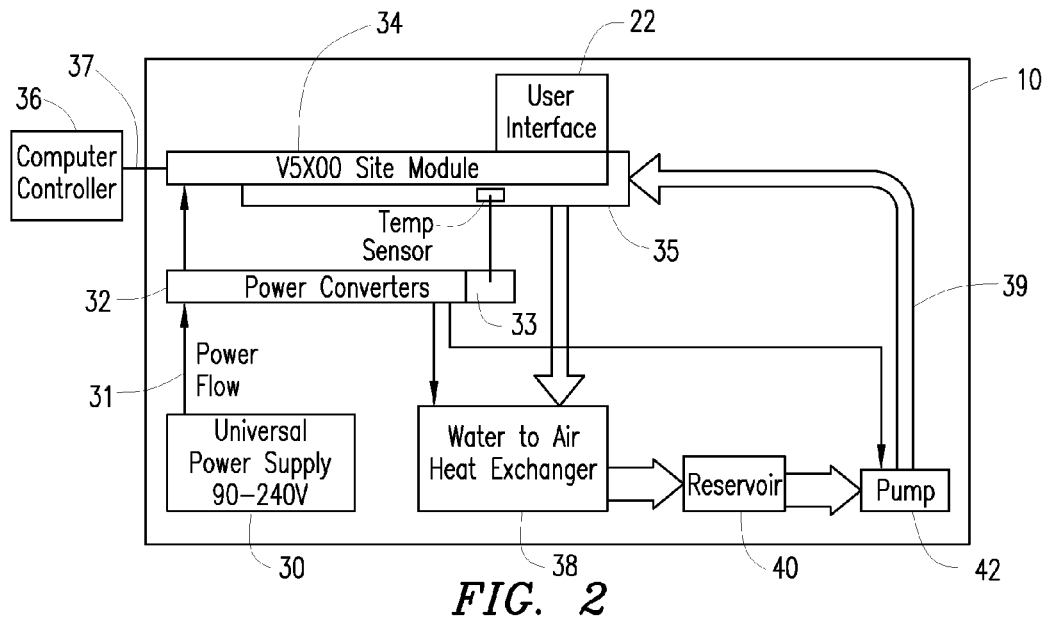
FIG. 2 depicts a block diagram of the major subsystem within an exemplary engineering workstation.

Referring now to FIG. 2, a block diagram of an exemplary engineering workstation is depicted. A universal power supply 30 is provided. The universal power supply receives ordinary office power from a standard office electrical outlet. There is no requirement for routing high voltage or high power connections to the office or cubicle in which the workstation 10 is being used. The universal power supply 30 is designed to receive any standard office voltage from between about 90 to 240 volts AC, so that the exemplary workstation can be used by an office outlet in substantially any country. Furthermore, the power supply 30 is power factor corrected in order to provide additional voltage and power regularity as well as enable embodiments of the invention to meet certain European standards and requirements for office equipment.

The universal power supply 30 provides 48 DC volts to a DC bus 31. The DC bus 48 is connected to a power converter block 32. The power converter block 32 comprises a plurality of power converters that deliver a variety of voltages to other devices in the workstation 10. During conversion to the various voltages heat is generated and some of the energy is lost as heat. In some embodiments of the invention, 5 to about 30% of the energy in the form of heat is lost when converting from the 48 volts DC to the other necessary voltages. The heat is dissipated from the power converters using airflow over the power converter portion 32 of the workstation 10. Heat sinks and fans are used to help dissipate the heat.

The power converters 32 provide needed voltages to, among other things, the site module 34, the water-to-air heat exchanger 38, and the pump 42. In an exemplary embodiment, the fan(s) associated with the water-to-air heat exchanger 38 are used to move air over the power converter portion 32 and dissipate the heat generated there.

One of the places the power converter 32 provides electrical energy is to the site module 34. The site module 34 provides the testing functionalities that are connected to the interface or DUT interface connector 22. The site module will be discussed further below with respect to FIG. 3.

The controller 36 is connected to the workstation 10 and is in electrical and/or signal communication with the site module 34. The controller 36 may be a personal computer, laptop or other microprocessor based computer used by the user, test engineer, or test program programmer. The keyboard, mouse and monitor(s) (shown in FIG. 1) may be connected to the computer controller 36 for the user to interface with. The computer controller 36 uses and/or interfaces with the test program and provides appropriate instruction signals to the workstation 10 and the site module 34. The computer controller also receives signals and feedback from the workstation 10 and/or the site module 34. The communication connection between the computer controller 36 and the workstation is a LAN line 37 providing at least a 100 megabit per second transfer rate.

The power converter block 32 may also include circuitry 33 that controls the cooling and fluid flow of the cooling fluid within the workstation 10. The cooling control circuitry 33 may be located elsewhere in the workstation 10. The cooling control circuitry 33 normally operates the cooling fans (which may be part of the water-to-air heat exchanger 38) at a minimum speed or lower speed setting. The lower speed setting keeps the electronics of the site module 34 and power converter section 32 cool and further keeps the overall noise of the workstation 10 low. In certain conditions, when, for example, power is being used to test a DUT the temperature within the workstation 10 and among the electronics of the site module 34 and power converters 32 will rise.

The temperature is sensed, at least, on the site module 34. Temperature may also be sensed in the cooling fluid 39 or at or near the power converters 32. The sensed temperature is provided to the cooling control circuitry 33, which in turn may increase the fan speed to a medium or higher speed or setting. The cooling control circuitry may also increase to pump speed and thereby increase the cooling fluid flow through or past the site module 32.

At this time the fluid flow will be discussed. The cooling fluid 39 accumulates in reservoir 40. The cooling fluid 39 is a propylene glycol and water mix. An exemplary embodiment's cooling fluid 39 is about 30% propylene glycol. The propylene glycol inhibits fungus and bacteria from growing in the cooling fluid 39, it also stops the cooling fluid 39 from freezing during storage and shipment of the workstation 10. Other cooling fluids that are water based can also be used in embodiments of the invention. The amount of cooling fluid used in an exemplary workstation is less than 0.5 gallons. The cooling system is a closed system such that there is no requirement to add to or change the cooling fluid 39 in the workstation 10.

The pump 42 extracts cooling fluid 39 from the reservoir 40. The pump 42, like a fan, is a noise producing element in an exemplary workstation 10. In order to keep noise to a minimum, a gear pump is used. Various other types of pumps will work in embodiments of the invention, but a gear pump was determined through experimentation to be the quietest for the system.

The pump 42 is controlled by the cooling control circuitry 33. An exemplary pump 42 has an average flow rate of about 0.4 gallons per minute operating at 40 psi. The pump may have a variable speed that is increased via signals or power provided by the cooling control circuitry 33 when the temperature sensed on the site module 34 increases.

It is important to understand that for test equipment to meet OSHA standards for operating in an office environment, one of the requirements is that the test equipment produces less than 55 decibels of sound. Embodiments of the present water cooled, self-contained engineering workstation 10 produce less than 55 decibels of sound and generally produces less than 52 decibels when operating at full cooling capacity. At full cooling capacity, embodiments of the invention can dissipate about 1200 watts of heat on a continuous basis in an office environment.

The cooling fluid 39 is moved by the pump 42 through a water block 35 that is part of the site module 34. An exemplary water block 35 is made of aluminum or other heat conducting material and allows the cooling fluid 39 to flow therethrough. The various printed circuit boards associated with the site module 34 are attached to the water block 35 such that heat generated in the site module printed circuit boards is dissipated, transferred or thermally conducted to the water block 35. The heat is then carried away from the water block 35 by the cooling fluid 39 to the water-to-air heat exchanger 38.

An exemplary water block 35 may be about a half an inch thick with printed circuit boards mounted on a top and bottom side of the water block 35 (creating a sort of sandwich). The major components that generate heat in the site module are in thermal communication with the water block 35 to aid an effective dissipation of heat.

An exemplary cooling system operates to keep the temperature of the water block 35 at about 30 degrees Celsius +/−about 3 degrees Celsius. The reasoning for this temperature range is that an exemplary workstation 10 operates in an office environment which is generally kept between 20 and 27 degrees Celsius. Since exemplary embodiments are water cooled without a compressor, the water block can be effectively maintained a few degrees warmer than normal office temperature. Calibration of test equipment is critical to its accurate functionality. The calibration of the site module and the DUT will change as the temperature changes so it is critical to keep the temperature within a close range of the +/−3 degrees Celsius.

Again, since an office environment is generally a few degrees below 30 degrees Celsius, then the workstation 10 will be operating in a temperature range that provides a stable operating temperature. One understands that the operating temperature range of the water block 35 may be adjusted up or down by the user if necessary, but the cooling system will keep the water block within +/−3 degrees Celsius of the set operating temperature.

In most embodiments, the operating temperature of the water block is maintained at least two or more degrees higher than the office room temperature in order to provide temperature stability.

The cooling fluid 39 flows from the water block 35 to the water-to-air heat exchanger 38 and then back to the reservoir 40. The water-to-air heat exchanger 38 may look like a radiator wherein water flows through coils with various metal cooling fans attached thereto. One or more fan(s) (not specifically shown) blows or forces air through or across the water-to-air heat exchanger 40. The fan speed is controlled by the cooling control circuitry 33. The air enters the inlet and exits the exhaust access holes 12 (shown in FIG. 1).

Embodiments of the engineering workstation operate at below the OSHA sound requirement of 55 decibels for an office environment. Furthermore, embodiments of the invention meet the U.S. EMC (Electro Magnetic Compatibility) requirements and the European CE requirements for office equipment.

Figure 3:
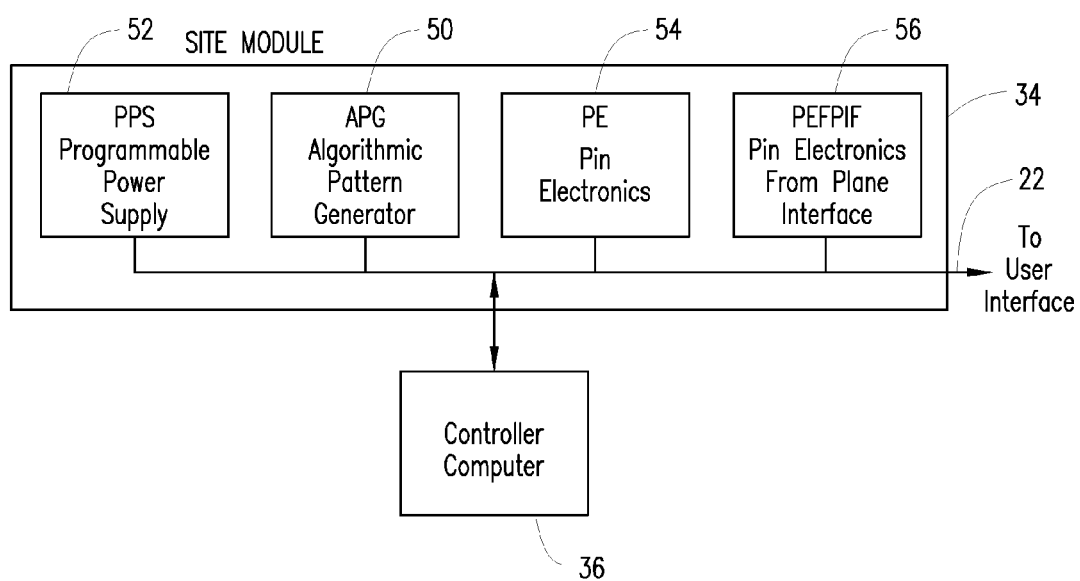
FIG. 3 is a block diagram of an exemplary site module inside an exemplary engineering workstation.

Referring now to FIG. 3, a block diagram of an exemplary site module 34 is shown. The site module 34 is an important part of the workstation 10 because it comprises the circuitry or circuit boards that perform various tests on the DUT via the DUT interface connector 22. The site module 34 of an exemplary workstation 10 is compatible with the larger test equipment used on the manufacturing or testing floor. An exemplary site module 34 comprises a dynamic APG (algorithmic pattern generator) 50. The APG 50 circuitry has a significant amount of memory in order to store and generate a multitude of digital test patterns used to test the DUT 26 and capture or recognize errors generated by the DUT.

A programmable power supply (PPS) 52 circuit or PCB provides positive and negative voltages to the DUT as required by the test program or designated by the user or test engineer. The PPS 52 may also include one or more parametric measurement units that measure, for example, the current that the DUT is using at a predetermined moment in time.

Another type of circuitry found on the site module 34 is the pin electronics (PE) 54 circuitry. The PE 54 converts signals that are used by the electronics of the exemplary workstation 10 and converts them to the type of signals (i.e., edge speed, rise time, amplitude, etc.) that is used by the DUT 16. The PE 54 may use drivers, comparators, receivers and programmable loads to drive the I/O channels of the workstation 10 through the DUT interface 22, to and from the DUT 26.

The pin electronics front plane interface (PEFPIF) 56 provides the signals and receives the signals to and from the DUT interface connector 22. The PE 54 and PEFPIF 56 provide signals in a correct physical format for the DUT.

The PPS 52, APG 50, PE 54, and PEFPIF 56 are connected to a bus or back plane that allows them to interface with, and be controlled by, the controller computer 36, its program and the user. The interface between the controller computer 36 and the bus or backplane is a LAN operating at least 100 megabits per second. Other interfaces of similar or higher data speeds may also be useable in exemplary embodiments of the invention.

Embodiments of the present invention may use the same or similar site module used in very large production line or test facility test devices that use enormous amounts of energy compared to an exemplary engineering station, require external cooling devices and test ten or more DUTs at a time. An exemplary workstation 10 allows a test engineer to create a test program for a DUT in the comfort of his office or cube. The test program created will be 100% compatible with the large production test machinery on the production line or test facility floor. Exemplary workstations allow a user to develop test programs independent of a large scale production system, while maintaining total compatibility.

The power requirements of an exemplary workstation 10 can be provided by a universal voltage input of 90–240 volts AC, which is available in any standard outlet in an office/lab environment. Although an exemplary workstation 10 needs to dissipate a significant amount of heat (from 800 to about 1200 watts) generated by the power converters 32 and the site module 34, the heat is dissipated via an internal fan(s) and a water-to-air heat exchanger 38. The power converters 32 are air cooled by fan forced air while heat from the site module electronics 34 is dissipated to a water block 35 that is internal to the workstation 10. An exemplary workstation incorporates a pump 42, water-to-heat exchanger 38, fans, and a cooling fluid to remove heat from the system and to keep the water block temperature within +/−3 degrees of a predetermined operating temperature. This rigid temperature control helps maintain calibration and DUT testing consistency.

There are basically two major sources of noise associated with an exemplary workstation 10; the pump and the fan(s). Care and experimentation was used in selecting a gear pump that delivers up to about 0.5 GPM of flow in the workstation's closed cooling loop. The pump and fan combination produce less than 55 decibels of sound while operating, and thereby pass OSHA noise standards for office equipment. Furthermore, exemplary embodiments of the workstation 10 are designed to fit under a desk or lab table and weigh less than 125 pounds. Casters can be placed on the bottom of the workstation for easier mobility.

Although only certain embodiments of the invention have been illustrated in the accompanying Figures and discussed in the foregoing detailed description, it is understood that the invention is not limited to the embodiments disclosed, but is capable of additional rearrangements, modifications, and substitutions. Accordingly, it should be understood that the scope of the present invention encompasses all such arrangements and is solely limited by the claims as follows.

What is claimed as new and desired to be protected by Letters Patent of the United States is:

1. An engineering work station that aids a user in the creation of an electronic device test program, said engineering work station comprising:
    a cabinet;
    electronic circuitry, inside said cabinet, that is electrically connected to and conducts electronic tests on an electronic device external to said cabinet;
    a water-to-air heat exchanger, inside said cabinet, said water-to-air heat exchanger including at least one fan for moving air past said water-to-air heat exchanger;
    a reservoir, inside said cabinet, for holding a cooling fluid;
    a cooling block, inside said cabinet, in heat conductive communication with predetermined elements of said electronic circuitry; and
    a pump, inside said cabinet, for pumping said cooling fluid from said reservoir and through said cooling block and said water-to-air heat exchanger; said engineering work station operating at a noise level that is below 55 decibels.

2. The engineering work station of claim 1, that meets OSHA office noise and power requirements.

3. The engineering work station of claim 1, wherein said engineering work station weighs less than 125 pounds when filled with said cooling fluid.

4. The engineering work station of claim 1 wherein said cabinet has dimensions of less than 17"w×30"d×22"h.

5. The engineering work station of claim 1, further comprising temperature control circuitry, inside said cabinet, that controls said pump and said at least one fan to operate to keep said cooling block within +/−3 degrees Celsius of a predetermined temperature.

6. The engineering work station of claim 1, wherein said combination of said pump, said cooling block, said water-to-air heat exchanger can operate with said cooling fluid to dissipate about 1200 watts of heat on a continuous basis when operating in an office environment.

7. The engineering workstation of claim 1, further comprising power supply circuitry, inside said cabinet, adapted to receive standard office alternating current voltages and convert said standard office alternating current voltages to a power corrected direct current voltage for use by other circuitry in said cabinet.

8. The engineering workstation of claim 7, wherein said other circuitry includes power converter circuitry that provides a plurality of necessary voltages to said electronic circuitry.

9. The engineering workstation of claim 1, wherein said electronic circuitry includes a site module that is functionally compatible and functionally identical to a manufacturing facility site module found in a large scale electronic device testing equipment.

10. A self-contained, liquid-to-air cooled, memory test engineering station comprising:
    memory test circuitry for testing an electronic memory device;
    a closed liquid-to-air cooling system comprising:
        a reservoir containing a cooling fluid;

a pump that pumps said cooling fluid from said reservoir;

a water block, in thermal communication with said memory test circuitry, that receives said cooling fluid from said pump;

a liquid-to-air heat exchanger system that dissipates heat from said cooling fluid; and a fan for moving air past said liquid-to-air heat exchanger; and a chassis cabinet containing said memory test circuitry and said closed liquid-to-air cooling system, said closed liquid-to-air cooling system operating at a sound level below 55 decibels.

11. The self contained, liquid-to-air cooled, memory test engineering station of claim 10, wherein said pump is a gear pump.

12. The self contained, liquid-to-air cooled, memory test engineering station of claim 10, wherein said memory test circuitry comprises:

algorithmic pattern generator circuitry;

a programmable power for providing a plurality of voltages to said electronic memory device; and PIN electronic circuitry for providing and receiving signals to said electronic memory device in a correct physical format.

13. The self contained, liquid-to-air cooled, memory test engineering station of claim 10, further comprising a universal power converter, inside said chassis cabinet, that is adapted to receive standard office voltages.

14. The self contained, liquid-to-air cooled, memory test engineering station of claim 13, wherein said standard office voltages are between 90 and 220 volts AC.

15. The self contained, liquid-to-air cooled, memory test engineering station of claim 10, wherein said memory test station weighs less than about 125 pounds, has dimensions of less than about 17"w×30"d×22"h, and dissipates up to about 1200 watts of heat in order to keep said water block within 3 degrees Celsius of a preset temperature when operating in an office environment.

16. An electronic device test engineering workstation, comprising:

a site module comprising memory test circuitry for testing an electronic device;

a plurality of power converters that provide a plurality of voltages to said site module to power said memory test circuitry;

a liquid-to-air cooling system, said liquid-to-air cooling system being a closed loop liquid system comprising a water based cooling fluid;

a water block in thermal communication with said site module and in thermal communication with said liquid-to-air cooling system, said liquid-to-air cooling system keeping said water block within +/−3 degrees of a predetermined temperature when operating; and a single cabinet containing said site module, said plurality of power converters, said liquid-to-air cooling system, and said water block, said engineering workstation producing less than 55 decibels of noise and dissipating up to about 1200 watts of heat energy when operating.

17. The electronic device test engineering workstation of claim 16, wherein said liquid-to-air cooling system comprises:

a reservoir that holds said water based cooling fluid;

a gear pump for pumping said cooling fluid from said reservoir and through said closed loop liquid system;

a liquid-to-air heat exchanger that exchanges heat from said water based cooling fluid to air moving past said liquid-to-air heat exchanger; and at least one fan for pushing said air past said liquid-to-air heat exchanger.

18. The electronic device test engineering workstation of claim 16, wherein said engineering work station weighs less than about 125 pounds.

19. The electronic device test engineering workstation of claim 16, wherein said test circuitry for testing an electronic device comprises:

algorithmic pattern generator circuitry;

a programmable power for providing a plurality of voltages to said electronic memory device; and PIN electronic circuitry for providing and receiving signals to said electronic memory device in a correct physical format.

20. The electronic device test engineering workstation of claim 16, further comprising power supply circuitry, inside said single cabinet, adapted to receive standard office alternating current voltages and convert said standard office alternating current voltages to a power corrected direct current voltage for use by said plurality of power converts.

* * * * *